United States Patent [19]

Takabayashi et al.

[11] Patent Number: 5,187,519
[45] Date of Patent: Feb. 16, 1993

[54] EXPOSURE APPARATUS HAVING MOUNT MEANS TO SUPPRESS VIBRATIONS

[75] Inventors: Yukio Takabayashi; Yukio Tokuda, both of Kawasaki, Japan

[73] Assignee: Canon Kabushiki Kaisha, Tokyo, Japan

[21] Appl. No.: 770,895

[22] Filed: Oct. 4, 1991

[30] Foreign Application Priority Data

Oct. 5, 1990 [JP] Japan .................................. 2-266683
Oct. 5, 1990 [JP] Japan .................................. 2-266684

[51] Int. Cl.⁵ .......................................... G03B 27/42
[52] U.S. Cl. .............................................. 355/53
[58] Field of Search ............... 355/30, 43, 53, 54; 378/34, 35; 364/508

[56] References Cited

U.S. PATENT DOCUMENTS

| | | | |
|---|---|---|---|
| 4,473,292 | 9/1984 | Mayer ..................................... | 355/53 |
| 4,595,282 | 6/1986 | Takabayashi ........................ | 355/53 |
| 4,676,630 | 6/1987 | Matsushita et al. ................... | 355/53 |
| 4,748,477 | 5/1988 | Isohata et al. ......................... | 355/53 |
| 4,803,712 | 2/1989 | Kembo et al. ......................... | 378/34 |
| 4,956,789 | 9/1990 | Hamada et al. ....................... | 364/508 |

FOREIGN PATENT DOCUMENTS

| | | |
|---|---|---|
| 0363164 | 4/1990 | European Pat. Off. . |
| 1489005 | 10/1977 | United Kingdom . |
| 2146133 | 4/1985 | United Kingdom . |
| 2153109 | 8/1985 | United Kingdom . |
| 2166879 | 5/1986 | United Kingdom . |

*Primary Examiner*—Richard A. Wintercorn
*Attorney, Agent, or Firm*—Fitzpatrick, Cella, Harper & Scinto

[57] ABSTRACT

An exposure apparatus for exposing a substrate with light from a light source has a stage for moving the substrate along a substantially horizontal plane, a base member for supporting the stage, and a frame member having at least three mounts for supporting the base member. A first actuator system having a plurality of first actuators provided in the mounts, respectively, moves the base member in a direction substantially parallel to the vertical direction. A second actuator system having at least one second actuator provided in at least one of the mounts moves the base member substantially along the horizontal plane. A control means is provided to control the first and second actuator systems in a such a way as to suppress vibration of the base member.

11 Claims, 4 Drawing Sheets

EXPOSURE APPARATUS HAVING MOUNT MEANS TO SUPPRESS VIBRATIONS

FIELD OF THE INVENTION AND RELATED ART

This invention relates to an exposure apparatus for manufacture of semiconductor devices, for example. More particularly, the invention is concerned with an exposure apparatus having an actuator means for determining absolute or relative position of a main assembly of the exposure apparatus with respect to a support portion of the exposure apparatus.

The degree of miniaturization and integration of a semiconductor device is increasing more and more. In exposure apparatuses for manufacture of such semiconductor devices, currently, step motion type projection exposure apparatuses (called "stepper") are prevalently used, and this will continue in future applications to the manufacture of ultra-fine devices. This means that the desirability of enhancing the resolving power of a stepper increases further.

According to Rayliegh's equation, the resolving power can be expressed as follows:

$$Re = k \times \lambda / NA$$

Based on this, attempts have been made to improve the resolving power by enlarging the numerical aperture (NA) of a projection lens while still using g-line (wavelength = 436 nm) as the exposure wavelength. However, the increase of NA is followed by a decrease in the depth of focus. On the other hand, improvements in respect to the design and fabrication of a projection lens have encountered a limit. This has forced use of a shorter wavelength of exposure light, to meet the need for submicron linewidth. Currently, steppers using i-line (wavelength = 365 nm) have been used practically, and, as a next era machine, a stepper using KrF excimer laser (wavelength = 248 nm) is expected preferable.

However, using such an excimer laser stepper involves some problems which have not been encountered by conventional steppers. As an example, if an excimer laser light source is used, the light source unit is very large as compared with a super Hg lamp which provides light of g-line or i-line. If, therefore, the excimer laser light source is mounted into a main assembly of the exposure apparatus, the exposure apparatus becomes bulky and heavy. This is not desirable in practical respect. An effective measure for this may be disposing a light source separately from the stepper main assembly. However, such separate disposition of a stepper main assembly and a light source raises a problem that the positional relationship between them is largely influential to the basic performance of the exposure apparatus. For example, a change in the relative position of them resulting from a change in attitude of the stepper causes misalignment of the axis of the laser beam or an error in the angle of incidence thereof. This results in non-uniformness in illuminance, which in turn leads to degradation of exposure precision or degradation of illuminance, causing a decrease in the throughput of the apparatus. There may be another measure such as enlarging the diameter of the laser beam. However, this causes an inconvenience of a decrease in throughput.

On the other hand, the resolving power and the throughput as well as the alignment precision can be enhanced by an improvement in vibration suppressing technique. As regards the vibration to be considered in a stepper, there are vibration transmitted from surrounding ambience (e.g. floor) and vibration produced by an internal movable portion of the apparatus. As for the technique for suppressing such vibration, conventionally, an anti-vibration table with mount means having a certain spring force and a certain damping force is used to support the main assembly of the apparatus. Namely, for the vibration from the floor, the resonance frequency of the apparatus is decreased by using a decreased spring constant of the mount means, to widen the vibration insulating region to thereby reduce the transmission factor. On the other hand, as for the vibration produced within the apparatus, the vibration energy is diffused by using an increased damping factor of the mount means, to assure convergence and stabilization in a short time.

Recently, there has been sold commercially a mount means (hereinafter "servo mount") having a feedback control system and being capable of producing a variable restoring force, to be used in place of the above-described simple mount means having a fixed spring constant and a fixed damping factor. In this serve mount, by means of an electromagnetic force or a hydraulic force, an actuator produces a force whose phase is corrected so as to strengthen the attenuation of vibration, in response to a measured level of acceleration of the main assembly of the apparatus supported by the mount means, in an attempt to obtain resonance free and vibration suppression effects. Currently, such a mount means is used as a vibration suppressing support device for precision instruments.

While these simple mounts or servo mounts have respective advantages for the vibration suppression in respective apparatuses, when a stepper is in question, there are some inconveniences such as follows. That is, in a stepper, an X-Y stage of the apparatus moves stepwise and this causes successive changes of a gravity center of the main assembly of the stepper. If, therefore, a conventional mount means is used as a vibration suppressing support means, after attenuation of vibration caused by a single or each stepwise motion, there remains in principle a static attitude change caused by a change in the gravity center point of the stepper. If, therefore, a separately disposed light source as described above is used, the change in attitude of the stepper causes a change in the relative position of the light source device and the stepper, which in turn causes misalignment of optical axis at the laser input portion.

On the other hand, there is a case wherein an autoleveling mechanism is used in a vibration suppressing mount means in order to keep a constant horizontal level of the main assembly of the apparatus. For example, where an air spring means is used in a mount means, valve opening/closing control is executed at plural mount legs independently of each other and in proportion to the deviation of the vertical position from a set level, to thereby maintain the horizontality of the apparatus.

SUMMARY OF THE INVENTION

It is accordingly an object of the present invention to provide a high-precision and high-throughput exposure apparatus wherein any vibration of a main assembly of the apparatus can be attenuated in a reduced time and wherein degradation in exposure precision or degradation of illuminance of exposure light due to a change in attitude of the main assembly of the exposure apparatus can be suppressed.

In accordance with an aspect of the present invention, there may be provided an exposure apparatus for projecting and printing a pattern, formed on an original, to an article to be exposed, in a step-and-repeat manner, wherein a mount means for supporting a main assembly of the exposure apparatus is equipped with means for determining an absolute position of the main assembly of the exposure apparatus as well as means for suppressing the vibration of the main assembly of the exposure apparatus.

As an example, plural mounts for supporting the main assembly of the exposure apparatus and having a vibration suppression controlling function, may include actuator means for producing forces in horizontal and vertical directions, and additionally they may have a positioning control function. Also, with such plural-mount structure, the absolute positioning with six (6) freedoms of the main assembly of the exposure apparatus may be ensured.

Also, means may be provided for retaining a predetermined positional relationship between the main assembly of the apparatus and various functional portions which are supported separately from the main assembly. As for examples of such functional portions supported separately from the main assembly of the apparatus, there may be a conveying system for transferring a wafer between it and an X-Y stage which is movable in X and Y directions along an X-Y plane, an illumination system for illuminating a pattern of a reticle, a reticle changer and an inspecting device for inspecting any foreign particle on a reticle.

In accordance with another aspect of the present invention, there may be provided an exposure apparatus for projecting and printing a pattern, formed on an original, on an article to be exposed, in a step-and-repeat manner by using a laser beam emitted from a separately disposed light source, wherein a mount means for supporting a main assembly of the apparatus uses a servo mount means which comprises a sensor means for detecting vibration of the main assembly of the apparatus and an actuator means for producing a force to attenuate the vibration in accordance with an output of the sensor means. Also, the apparatus may be equipped with a detecting means for introducing the laser beam from the light source and for detecting the relative position of the main assembly of the apparatus with respect to the light source, and a control means for energizing the actuator means so as to bring the light source and the main assembly of the apparatus into a predetermined positional relationship on the basis of a relative position deviation signal as produced by the detecting means.

As an example, a mount for supporting the main assembly of the exposure apparatus may be additionally provided with a plurality of sensors for detecting vibration in three directions of X, Y and Z, and actuator means for producing forces in these three directions, whereby the mount is equipped with vibration suppressing function. Additionally, in accordance with a signal representing a deviation in the relative position with the exposure light source, as detected at the laser beam input portion, the actuator means may be energized to effect the positioning control, to thereby assure relative positioning.

With the structure of the present invention, in addition to the vibration suppressing function, the positioning of the main assembly of the apparatus with respect to the absolute position or the relative position (relative to a separately disposed light source, for example) is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
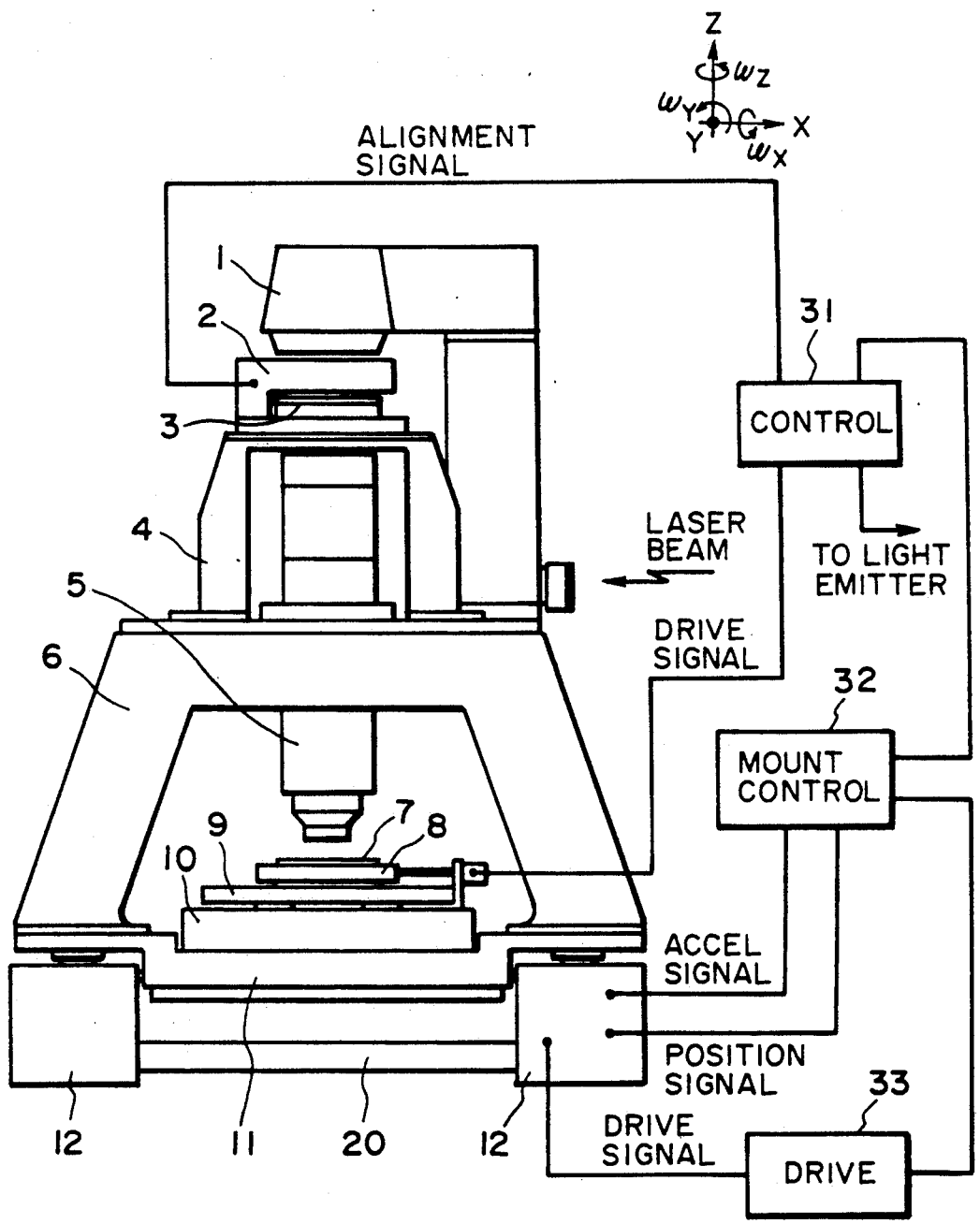
FIG. 1 is a schematic and diagrammatic view showing a general structure of an exposure apparatus according to an embodiment of the present invention.

FIG. 1 shows basic structure of a step-and-repeat type exposure apparatus according to an embodiment of the present invention, which apparatus is usable for manufacture of semiconductor devices.

In FIG. 1, denoted at 1 is an illumination system for directing a laser beam, incident on a light input (laser light inlet), to the upper surface of a reticle or mask 3; denoted at 2 is an alignment scope for detecting the position of the reticle 3 with respect to a reticle reference mark (not shown) and for detecting the position of a wafer 7 with respect to the reticle 3; and denoted at 3 is the reticle which bears a pattern to be transferred to the wafer. Denoted at 4 is a outer casing for supporting the reticle 3 and the alignment scope 2; denoted at 5 is a reduction projection lens system for projecting the pattern of the reticle to the wafer in a reduced scale; denoted at 6 is a barrel surface plate for supporting the projection lens 5 and the illumination system 1 as well as the outer casing 4; and denoted at 7 is the wafer. Denoted at 8 is an X stage for supporting the wafer 7 and being movable in the X direction; denoted at 9 is a Y stage for supporting the X stage 8 and being movable in the Y direction; denoted at 10 is a stage surface plate for supporting the Y stage 9; and denoted at 11 is a base surface plate for supporting the barrel surface plate 6 and the stage surface plate 10.

In the description of the present invention, the attitude or absolute position of the main assembly of the apparatus corresponds to such position that, where constitutional elements supported by the base surface plate 11 are considered as a single rigid member, it is represented by values in six freedoms (X, Y and Z directions and rotational wx, wy and wz directions about the X, Y and Z directions) in respect to three-dimensional X-Y-Z coordinates which can be set in a virtual space. Each of the X and Y directions in the X-Y-Z coordinates is substantially parallel to a horizontal plane, and the Z direction is substantially parallel to the vertical direction. Denoted by numerals 12-12 are mount means for supporting the base surface plate 11. The mount means is formed in four units (12-1, 12-2, 12-3 and 12-4 in FIG. 3) which are fixedly provided at four corners of the base surface plate 11 and which are coupled with each other by means of a frame 20. The provision of this mount means is one of essential features of the present embodiment.

Denoted at 31 is a control device for controlling the operation of the exposure apparatus as a whole. Denoted at 32 is a mount control device mainly for controlling the operation of the four mounts 12. Denoted at 33 is a driving device for driving actuators of the four mounts 12, respectively.

The operation of the exposure apparatus of the FIG. 1 structure will now be explained.

In operation, a wafer 7 is conveyed by an unshown wafer conveying system to the X-Y stage 8, and it is placed on and held by a wafer chuck (not shown) provided on the X-Y stage. After this, the control device 31 produces a drive signal for initiating stepwise motion for positioning the wafer 7 at its exposure position (exposure start position). In response to this, the X stage 8 and/or the Y stage 9 moves stepwise. Upon completion of this stepwise motion, final position measurement is effected by using the alignment scope 2 and, through the feedback of the obtained signal, the positioning of the X and Y stages 8 and 9 is completed.

On the other hand, any vibration from the floor or due to movement of the stage or any attitude change resulting from unbalanced load of the stage is measured by the mount means 12 (to be described later), and it is fed back to the mount control device 32 in the form of an acceleration signal or a displacement signal. This ensures quick vibration damping (vibration suppression) of the main assembly of the apparatus as well as quick positioning of the same. After completion of the vibration suppression and the positioning, the mount control device 32 produces and applies a completion signal to the control device 31.

As the control device 31 receives completion signals from the alignment scope 2 and the mount control signal 32, the control device 31 produces an instruction signal for effecting light emission of the light source device which is a laser light source in this embodiment. The laser light emitted by the light source goes through the illumination system 1, the reticle 3 and the projecton lens 5 which are included in the main assembly of the exposure apparatus, to illuminate the wafer 7 whereby the wafer 7 is exposed.

Figure 2:
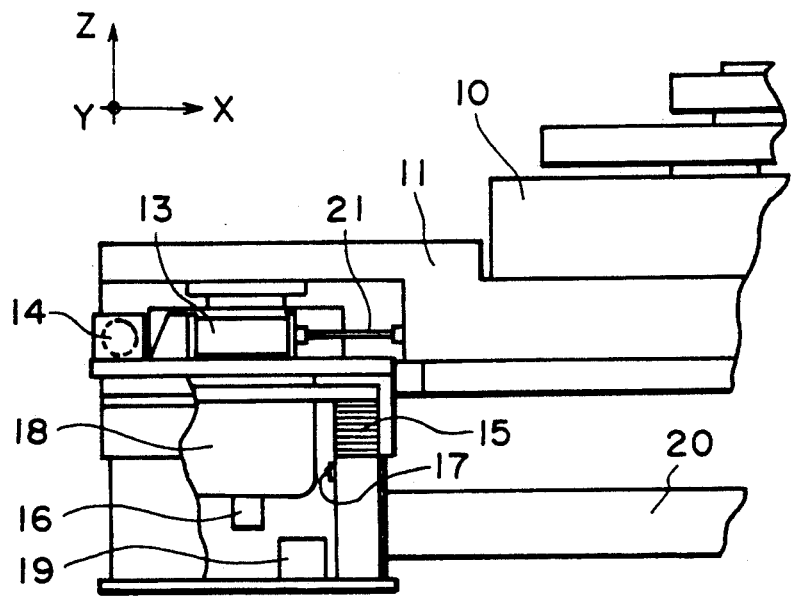
FIG. 2 is a fragmentary view showing details of a servo mount used in the FIG. 1 embodiment.
Figure 3:
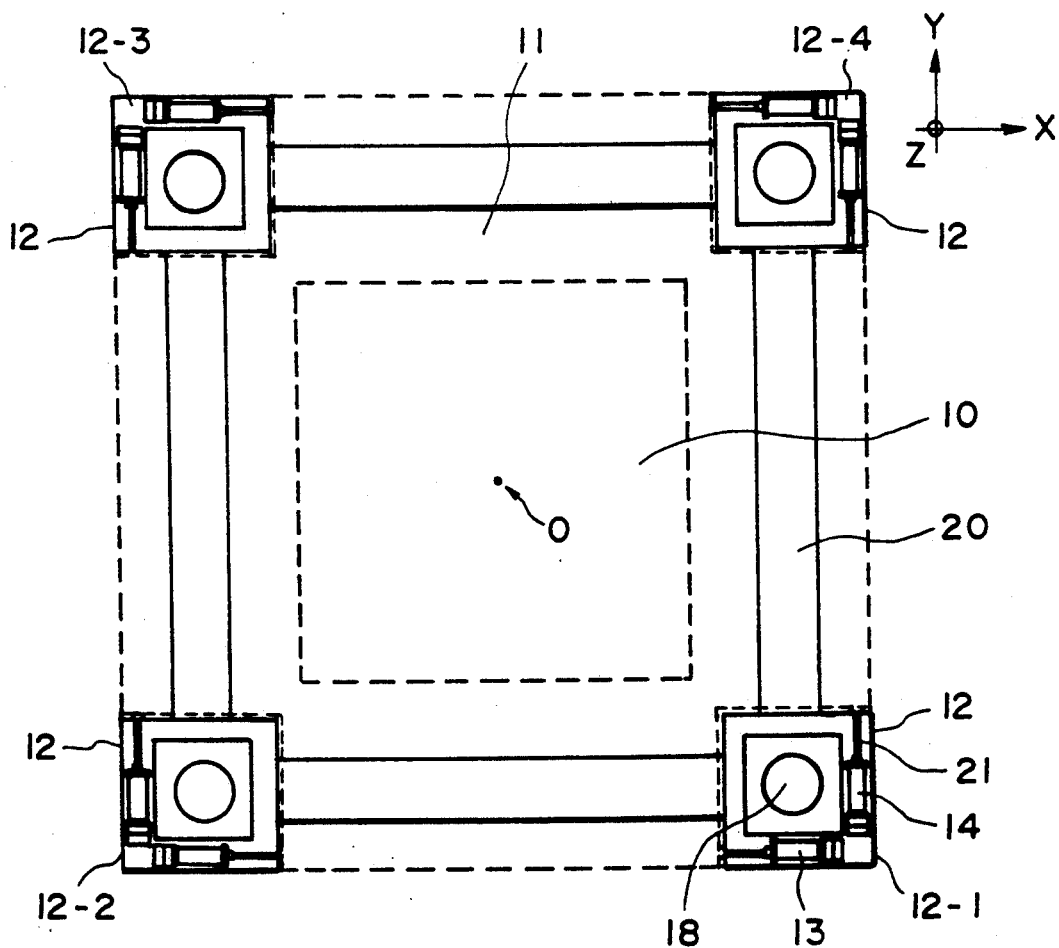
FIG. 3 is a top plan view of mount means, for illustrating the actuator arrangement in the servo mount means of this embodiment.

Referring now to FIGS. 2 and 3, details of the mount means 12 of the exposure apparatus of FIG. 1 will be explained. In FIGS. 2 and 3, reference numerals the same as those in FIG. 1 are assigned to corresponding elements.

The exposure apparatus of this embodiment includes four mounts 12. These mounts 12 are fixed by the mount frame 20. Each of the mounts 12 has three actuators 13, 14 and 18 corresponding to the three axes (directions). Among these actuators, a Z-axis actuator 18 (corresponding to the vertical direction which is perpendicular to the sheet of FIG. 3) may be provided by an air-spring actuator. Each of X-axis actuator 13 and Y-axis actuator 14 may be provided by a voice-coil type actuator, an air-cylinder type actuator or an air-spring actuator.

In mounting these X-axis, Y-axis and Z-axis actuators 13, 14 and 18, in each case it is necessary to use such a structure that is effective to release any force in five freedoms, other than the direction of action. This is attained in this embodiment as follows: First, as regards the Z-axis direction, like the case of a conventional servo mount, the air spring 18 is resiliently supported by the mount frame 20 with accumulated rubber layers 15 interposed therebetween. This ensures release of any thrust force in the X or Y direction as well as release of any rotational force about the X, Y or Z axis. It is to be noted here that the point of action of the air spring 18, that is, the movable portion which is movable in the Z direction, is fixed to the base surface plate 11. As regards the X-axis and Y-axis actuators 13 and 14, the four mounts 12 are fixedly supported by the mount frame 20. Namely, the actuators 13 and 14 are directly supported by the mount frame without intervention of the accumulated rubber layers 15. In consideration of this, each actuator 13 or 14 is coupled to its point of application of force to the base surface plate 11 by means of a rod-like member 21 such as a piano wire, for example, which is easily flexible in directions other than the direction of application of force. The rod-like member 21 of the X-axis actuator extends substantially in parallel to the X direction, while the rod-like member 21 of the Y-axis actuator 14 extends substantially in parallel to the Y direction. This arrangement assures release of any thrust force or rotational force in a direction other than its direction of application, on the basis of flexure of the rod-like member 21. As regards the change in attitude of the main assembly of the exposure apparatus, since currently the maximum displacement at the mount means can be kept in an order of a few millimeters, practically the above-described structure may be satisfactory. The servo valve 19 is controlled in response to a drive signal from the driving device 33, to control the air supply to the air spring 18.

Next, as for sensor means for vibration and position control, an acceleration pickup sensor 16 and a displacement sensor 17 are used. The acceleration pickup sensor 16 is mounted to a movable portion of the mount 12 (a portion integral with the base surface plate 11). The displacement sensor 17 is mounted to the mount frame 20 (fixed portion), and it measures the quantity of displacement of the movable portion of the mount 12.

The number of these sensors 16 or 17 is variable in accordance with the form of the control system to be used. As an example, if four mounts 12 are to be controlled independently of each other, each mount 12 should be equipped with acceleration pickup sensors 16 of a number necessary for detecting the acceleration in each of three freedoms (X, Y and Z directions) as well as displacement sensors 17 of a number necessary for detecting displacement in each of three freedoms (X, Y and Z directions). If a decrease in the number of sensors is desired, four mounts may be controlled non-independently and, in that occasion, use of only two sets of three-freedom acceleration pickup sensors 16 and two sets of three-freedom displacement sensors 17 may be sufficient. However, decreasing the number of sensors may have an adverse effect against quick calculation and response of the control system.

In the embodiment as shown in FIG. 3, the four mounts 12 will hereinafter be referred to as a first mount 12-1, a second mount 12-2, a third mount 12-3 and a fourth mount 12-4, respectively. These four mounts 12-1–12-4 are distributed along the X-Y plane so as to surround the stage surface plate 10, and they are disposed at four corners of the mount frame 20 having a substantially square shape. The center O of the surface plate 10 is substantially aligned with the optical axis of the projection lens 5. Each of the four mounts 12 is equipped with a Z-axis acceleration detecting pickup (16). Each of the first mount 12-1 and the third mount 12-3 is provided with an X-axis acceleration detecting pickup (16). Each of the second mount 12-2 and the fourth mount 12-4 is provided with a Y-axis acceleration detecting pickup (16). An acceleration signal from each acceleration pickup 16 is fed back to the mount control device 32.

On the other hand, each of the first mount 12-1, the second mount 12-2 and the third mount 12-3 is equipped with a Z-axis displacement detecting sensor (17). Each of the first mount 12-1 and the third mount 12-3 is equipped with an X-axis displacement detecting sensor (17). The forth mount 12-4 is equipped with a Y-axis displacement detecting sensor (17). A position signal from each displacement sensor 17 is fed back to the mount control device 32.

The mount control device 32 then serves to integrate acceleration signals from each acceleration sensor 16 to produce a speed signal. Then, on the basis of the obtained speed signal, it produces a data signal for causing each actuator of the mount 12 to produce a force necessary to suppress the vibration of the main assembly of the exposure apparatus with respect to the X-Y-Z coordinates. Also, on the basis of the position signals from the displacement sensors 17, the mount control device produces a data signal for correcting the attitude and displacement of the main assembly of the exposure apparatus with respect to the X-Y-Z coordinates. Based on these data signals, the control device 33 controls the actuators of the mounts 12. That is, the actuators are controlled so as to produce a force which is proportional to an absolute speed, obtained by integrating the accelerations detected by the acceleration sensors 16, and which has a phase difference with respect to the detected vibration.

The operation of the actuators of the four mounts 12 will now be explained. As regards the Z-axis motion and rotational motions (wx and wy) about the X and Y axes, the vibration suppression and the positioning are effected by means of air springs 18 (Z-axis actuators) of the four mounts. As regards the motion along the X-Y plane, the control is done by using forces produced by two pairs of X-axis actuators and two pairs of Y-axis actuators, wherein each pair comprising two actuators opposed to each other along a certain axis (e.g. a pair comprising the X-axis actuator 13 of the first mount 121-1 and the X-axis actuator 13 of the second mount 12-2). As regards the motion in the X direction, two pairs of X-axis actuators 14 are used to execute the vibration suppression and the positioning. Similarly, as regards the Y direction, two pairs of Y-axis actuators 15 are used to execute the vibration suppression and the positioning. As regards the motion (wz) about the Z axis, the vibration suppression and the positioning are effected by using "couple of forces" which can be produced by two pairs of X-axis actuators 14 and two pairs of Y-axis actuators 15.

Figure 4:
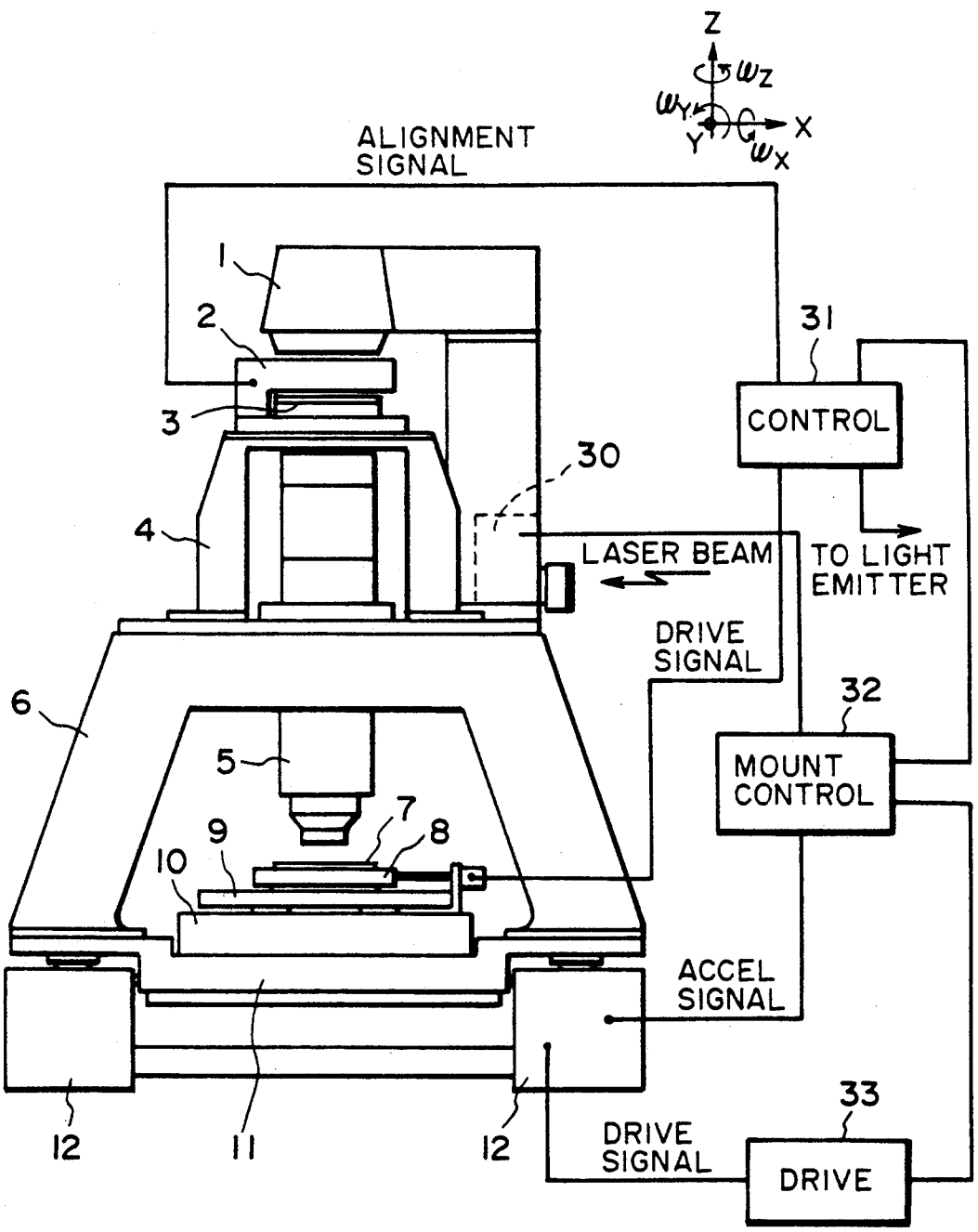
FIG. 4 is a schematic and diagrammatic view showing a general structure of an exposure apparatus according to another embodiment of the present invention.

FIG. 4 is a front elevational view showing a basic structure of a step-and-repeat type exposure apparatus according to another embodiment of the present invention.

In FIG. 4, denoted at 1 is an illumination system for directing a laser beam, incident on a light input (laser light inlet), to the upper surface of a reticle or mask 3; denoted at 30 is a position detecting means for detecting the position of incidence of the laser light inputted into a portion of the illumination system 1; denoted at 2 is an alignment scope for detecting the position of the reticle 3 with respect to a reticle reference mark (not shown) and for detecting the position of a wafer 7 with respect to the reticle 3; and denoted at 3 is the reticle which bears a pattern to be transferred to the wafer. Denoted at 4 is an outer casing for supporting the reticle 3 and the alignment scope 2; denoted at 5 is a reduction projection lens system for projecting the pattern of the reticle to the wafer in a reduced scale; denoted at 6 is a barrel surface plate for supporting the projection lens 5 and the illumination system 1 as well as the outer casing 4; and denoted at 7 is the wafer. Denoted at 8 is an X stage for supporting the wafer 7 and being movable in the X direction; denoted at 9 is a Y stage for supporting the X stage 8 and being movable in the Y direction; denoted at 10 is a stage surface plate for supporting the Y stage 9; and denoted at 11 is a base surface plate for supporting the barrel surface plate 6 and the stage surface plate 10.

Denoted by numerals 12-12 are mount means for supporting the base surface plate 11. The mount means is formed in four units (12-1, 12-2, 12-3 and 12-4 such as shown in FIG. 3) which are fixedly provided at four corners of the base surface plate 11 and which are coupled with each other by means of a frame 20. The provision of this mount means is one of the essential features of the present embodiment.

Denoted at 31 is a control device for controlling the operation of the exposure apparatus as a whole. Denoted at 32 is a mount control device mainly for controlling the operation of the four mounts 12. Denoted at 33 is a driving device for driving actuators of the four mounts 12, respectively.

The operation of the exposure apparatus of the FIG. 4 structure will now be explained.

In operation, a wafer 7 is conveyed by an unshown wafer conveying system to the X-Y stage 8, and it is placed on and held by a wafer chuck (not shown) provided on the X-Y stage. After this, the control device 31 produces a drive signal for initiating stepwise motion for positioning the wafer 7 at its exposure position (exposure start position). In response to this, the X stage 8 and/or the Y stage 9 moves stepwise. Upon completion of this stepwise motion, final position measurement is effected by using the alignment scope 2 and, through the feedback of the obtained signal, the positioning of the X and Y stages 8 and 9 is completed.

On the other hand, any vibration from the floor or due to movement of the stage or any attitude change resulting from unbalanced load of the stage is measured by the mount means 12 (to be described later), and it is fed back to the mount control device 32 in the form of an acceleration signal or a displacement signal. This ensures quick vibration damping (vibration suppression) of the main assembly of the apparatus as well as quick positioning of the same.

The relative position of the main assembly of the exposure apparatus and the unshown light source device (which is disposed separately from the main assembly of the exposure apparatus) is detected by the light axis position detecting means 30 provided at the laser light input portion. An obtained position signal from the position detecting means 30 is inputted to the mount control device 32. On the basis of this position signal, the mount control device 32 controls the actuators of the mounts 12, whereby the positioning of the main assembly of the exposure apparatus is accomplished.

After completion of the vibration suppression and the positioning, the mount control device 32 produces and applies a completion signal to the control device 31. As the control device 31 receives completion signals from the alignment scope 2 and the mount control signal 32, the control device 31 produces an instruction signal for effecting light emission of the light source device which is a laser light source in this embodiment. The laser light emitted by the light source goes through the illumination system 1, the reticle 3 and the projection lens 5 which are included in the main assembly of the exposure apparatus, to illuminate the wafer 7 whereby the wafer 7 is exposed. The structure of the mount means 12 as well as the disposition of them are essentially the same as those of the preceding embodiment.

Figure 5:
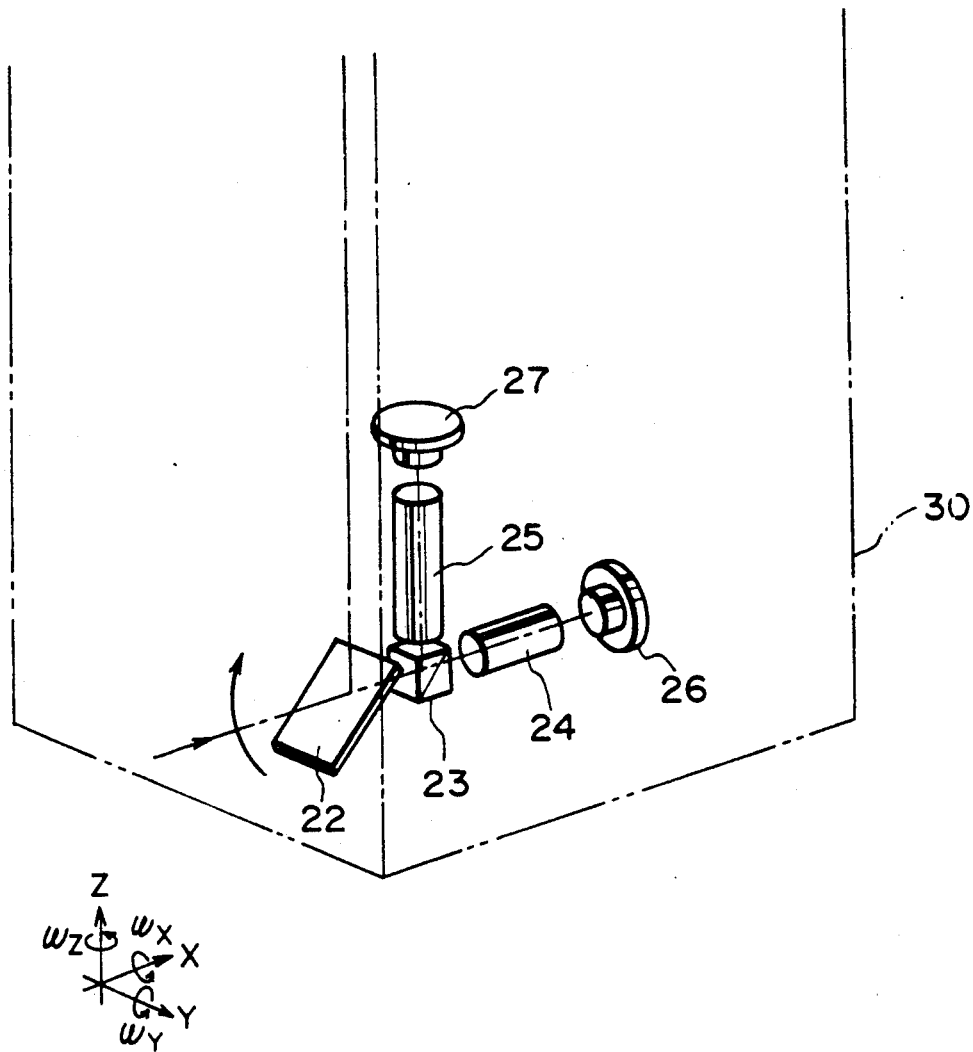
FIG. 5 is a fragmentary view showing details of a position detecting means for detecting relative position of a laser beam input portion.

Referring now to FIG. 5, details of the position detecting means 30 of the exposure apparatus of FIG. 4 will be explained. FIG. 5 shows details of the laser light input portion which is a part of the illumination system 1. The position detecting means 30 is a unit for detecting the relative position of the main assembly of the exposure apparatus and the light source device by using the laser light from the light source device.

Upon detection of the relative position, a swingable mirror 22 is moved to and held at its lift-up position. At this time, the input laser light coming substantially in parallel to the X axis is incident on a half mirror 23, whereby it is divided into a transmitted light going straight and a reflected light. The laser light which goes straight passes through a Fourier transformation lens 24 and is incident on a tilt detecting sensor 26. By this tilt detecting sensor 26, any inclination of the axis of the laser light with respect to the wy or wz direction can be detected. The other laser light passes through an imaging lens 25 and is incident on a position detecting sensor 27. By this position detecting sensor 27, any positional deviation of the axis of the laser beam in respect to the Y or Z direction can be detected. The obtained detection signals from these sensors are applied to the mount control device 32 as feedback signals for the positioning of the main assembly of the exposure apparatus. Upon exposure of a wafer, the swingable mirror 22 is moved down, such that it serves to direct the laser light to the illumination system 1.

In the exposure apparatus of this embodiment, acceleration pickup sensors 16 such as shown in FIG. 2 are used as the sensor means for the vibration suppression control. Each acceleration pickup sensor is mounted to a movable portion of the mount 12 (a portion integral with the base surface plate 11). The structure of the remaining portion of this embodiment as well as the vibration suppression and positioning functions of the four mounts 12 are essentially the same as those of the FIG. 1 embodiment, and duplicate explanation is omitted here.

Since in the present embodiment a position sensor means 27 is provided at the inlet portion for receiving the light from the laser light source, it is possible to omit the position sensors 17 in the mounts 12. Thus, the cost of the apparatus can be decreased and the structure of the mount means can be simplified. This makes it possible to reduce the size of the mount means, as compared with the FIG. 1 embodiment. Also, it provides advantageous effects in respect to changes with time in the relative displacement to be caused by drift of the position sensor 17.

While four mounts 12 are used in the foregoing embodiments to support the main assembly of the exposure apparatus, the number of the mounts is not limited to this. Clearly, using at least three mounts enables embodying the present invention. Further, it is not necessary that each of the mounts is equipped with both of the X-axis and Y-axis actuators. Each mount may have only one actuator.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate with light from a light source, comprising:
   a stage for moving the substrate substantially along a horizontal plane;
   a base member for supporting said stage;
   a frame member having at least three mounts for supporting said base member with respect to a vertical direction;
   first actuator means having a plurality of first actuators provided in said mounts, respectively, for moving said base member in a direction substantially parallel to the vertical direction;
   second actuator means having at least one second actuator provided in at least one of said mounts, for moving said base member substantially along the horizontal plane; and
   control means for controlling said first and second actuator means so as to suppress vibration of said base member.

2. An apparatus according to claim 1, further comprising a first sensor for detecting displacement of said base member to said frame member in the vertical direction and a second sensor for detecting displacement of said base member to said frame member along the horizontal plane, wherein said control means controls at least one of said first and second actuator means on the basis of outputs of said first and second sensors.

3. An apparatus according to claim 1, further comprising a photoelectric sensor for photoelectrically detecting the light from the light source to detect at least one of the position and the attitude of said base member with respect to the light source, wherein said control means controls at least one of said first and second actuator means on the basis of an output of said photoelectric sensor.

4. An apparatus according to claim 1, further comprising a first sensor for detecting vibration of said base member in the vertical direction and a second sensor for detecting vibration of said base member in a horizontal direction, wherein said control means controls at least one of said first and second actuator means on the basis of output of said first and second sensors.

5. An apparatus according to claim 4, further comprising a third sensor for detecting displacement of said base member to said frame member in the vertical direction and a fourth sensor for detecting displacement of said base member to said frame member along the horizontal plane, wherein said control means controls at least one of said first and second actuator means on the basis of outputs of said third and fourth sensors.

6. An apparatus according to claim 4, further comprising a photoelectric sensor for photoelectrically detecting the light from the light source to detect at least one of the position and the attitude of said base member with respect to the light source, wherein said control means controls at least one of said first and second actuator means on the basis of an output of said photoelectric sensor.

7. An apparatus according to claim 4, wherein each of said first and second sensors comprises an acceleration sensor.

8. An exposure apparatus for exposing a substrate with light from a light source, comprising:
   a projection optical system for projecting a pattern on different portions of the substrate by using light from said light source;
   an X-Y stage for moving the substrate substantially along a horizontal plane, to expose the different portions of the substrate with the light in sequence;
   a base member for supporting said projection optical system and said X-Y stage;
   a frame member having at least three mounts for supporting said base member with respect to a vertical direction;
   first actuator means having a plurality of first actuators provided in said mounts, respectively, for moving said base member in a direction substantially parallel to the vertical direction; and
   second actuator means having at least one X-axis actuator provided in at least one of said mounts and at least one Y-axis actuator provided in at least one of said mounts, for moving said base member substantially along the horizontal plane.

9. An apparatus according to claim 8, wherein said second actuator means has at least three actuators which are operable to rotationally displace said base member substantially along the horizontal plane.

10. A semiconductor device manufactured by a process which includes a step of preparing a substrate and an original having a circuit pattern and a step of transferring the circuit pattern of the original onto the substrate by using an exposure apparatus, wherein the step of transferring the circuit pattern comprises the substeps of:
   illuminating the original with a light source;
   moving a stage containing the substrate along a substantially horizontal plane;
   supporting said stage with a base member;
   supporting said base member with respect to a vertical direction with a frame member having at least three mounts;
   moving said base member in a direction substantially parallel to the vertical direction with first actuator means having a plurality of first actuators provided in said mounts, respectively;
   moving said base member along the substantially horizontal plane with second actuator means having at least one second actuator provided in at least one of said mounts; and
   controlling said first and second actuator means with a control means to suppress vibration of said base member.

11. A semiconductor device manufactured by a process which includes a step of preparing a substrate and an original having a circuit pattern and a step of transferring the circuit pattern of the original onto the substrate by using an exposure apparatus, wherein the step of transferring the original comprises the substeps of:
   illuminating the original with a light source;
   projecting the circuit pattern of the original onto different portions of the substrate with a projection optical system using light from said light source;
   moving an X-Y stage containing the substrate along a substantially horizontal plane to expose the different portions of the substrate with the light in sequence;
   supporting said projection optical system and said X-Y stage with a base member;
   supporting said base member with respect to a vertical direction with a frame having at least three mounts;
   moving said base member in a direction substantially parallel to the vertical direction with first actuator means having a plurality of first actuators provided in said mounts, respectively; and
   moving said base member along the substantially horizontal plane with second actuator means having at least one second actuator provided in at least one of said mounts, and at least one Y-axis actuator provided in at least one of said mounts.

* * * * *